United States Patent
Hasegawa et al.

(10) Patent No.: US 7,268,984 B2
(45) Date of Patent: Sep. 11, 2007

(54) MAGNETIC DETECTING ELEMENT HAVING A SELF-PINNED LAYER

(75) Inventors: Naoya Hasegawa, Niigata-ken (JP); Masamichi Saito, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 312 days.

(21) Appl. No.: 11/156,868

(22) Filed: Jun. 20, 2005

(65) Prior Publication Data
US 2005/0280955 A1    Dec. 22, 2005

(30) Foreign Application Priority Data
Jun. 21, 2004    (JP)    ............... 2004-182286

(51) Int. Cl.
    *G11B 5/33*    (2006.01)
(52) U.S. Cl. ................................. 360/324.11
(58) Field of Classification Search ........... 360/324.11, 360/324.1
    See application file for complete search history.

(56) References Cited

U.S. PATENT DOCUMENTS

| | | | |
|---|---|---|---|
| 5,583,725 A | | 12/1996 | Coffey et al. |
| 5,648,885 A | * | 7/1997 | Nishioka et al. ........ 360/324.12 |
| 6,256,222 B1 | * | 7/2001 | Sakakima et al. ........... 365/158 |
| 7,126,797 B2 | * | 10/2006 | Hasegawa et al. ........ 360/324.1 |
| 7,220,499 B2 | * | 5/2007 | Saito et al. .............. 428/811.5 |

FOREIGN PATENT DOCUMENTS

| | | |
|---|---|---|
| JP | 2002-319112 | 10/2002 |
| JP | 2003-031867 | 1/2003 |

* cited by examiner

*Primary Examiner*—Angel Castro
(74) *Attorney, Agent, or Firm*—Brinks Hofer Gilson & Lione

(57) ABSTRACT

A CPP magnetic detecting element having a pinned magnetic layer whose magnetization is fixed by its uniaxial anisotropy in a structure that CIP magnetic detecting elements do not allow. In the CPP magnetic detecting element, the upper and lower surfaces of a pinned magnetic layer having an artificial ferrimagnetic structure are disposed between a magnetostriction-enhancing layer made of a nonmagnetic metal and a nonmagnetic material layer having a higher lattice constant than Cu. CPP magnetic detecting elements allow this structure without reducing the variation in resistance per unit area $\Delta R \cdot A$. Thus, the magnetostriction coefficient of the pinned magnetic layer can be increased from above and below, thereby more firmly fixing the magnetization of the pinned magnetic layer.

13 Claims, 7 Drawing Sheets

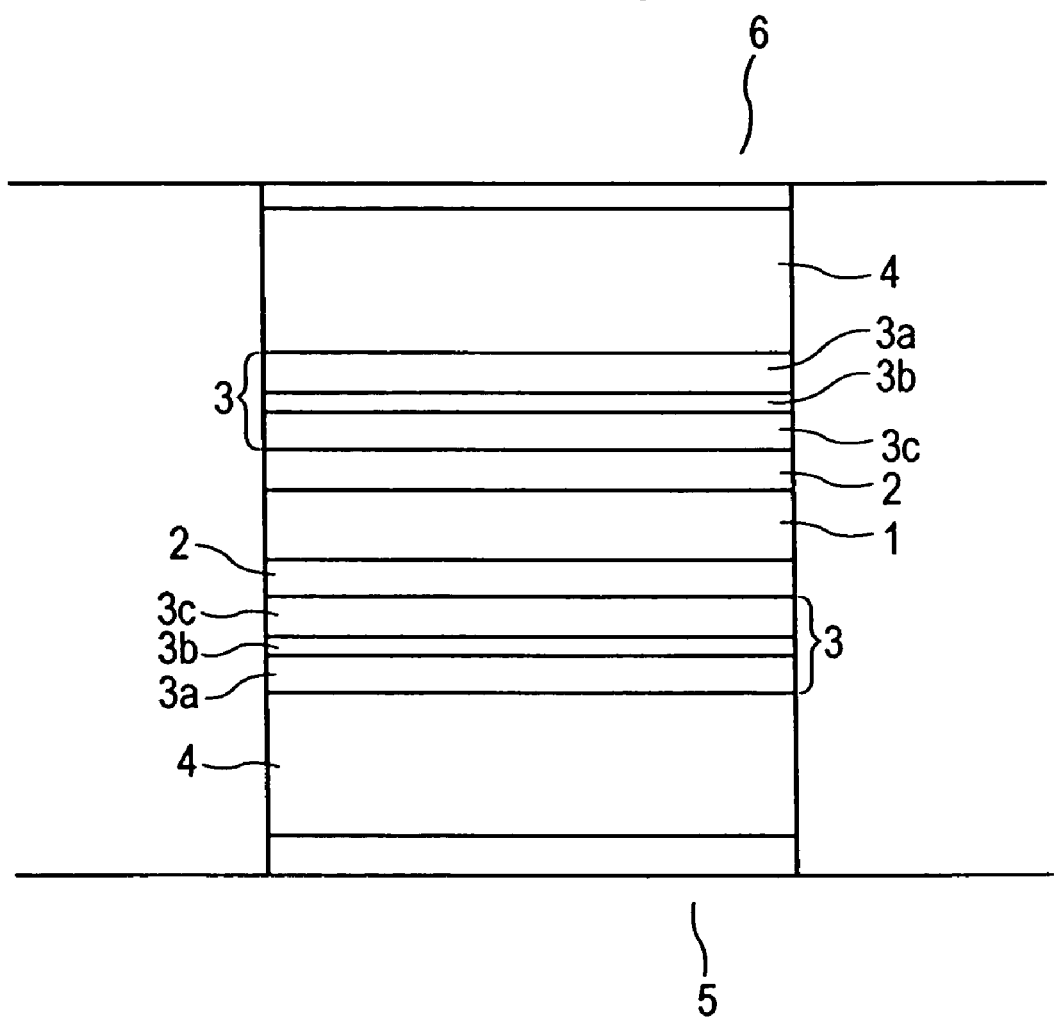

MAGNETIC DETECTING ELEMENT HAVING A SELF-PINNED LAYER

This application claims the benefit of priority to Japanese Patent Application No. 2004-182286, filed on Jun. 21, 2004, herein incorporated by reference.

BACKGROUND OF THE INVENTION

1. Field of the Invention

The present invention relates to CPP (current-perpendicular-to-the-plane) magnetic detecting elements, and particularly to a CPP magnetic detecting element having a structure which CIP (current-in-the-plane) magnetic detecting elements do not allow and in which the magnetization of a pinned magnetic layer is more firmly fixed by the uniaxial anisotropy of the pinned magnetic layer.

2. Description of the Related Art

A magnetic detecting element having a multilayer composite including a free magnetic layer, a nonmagnetic material layer, and a pinned magnetic layer may be of a CIP type or a CPP type, according to the direction of current flowing in the multilayer composite.

In a CIP magnetic detecting element, current flows in a direction parallel to the surfaces of the layers of the multilayer composite. In a CPP magnetic detecting element, current flows in the direction perpendicular to the surfaces of those layers.

The CPP magnetic detecting element generally has an advantage that the size can be reduced to increase the reproduction power in comparison with the CIP magnetic detecting element. It is therefore believed that the CPP magnetic detecting element has a structure capable of achieving a high density recording, and that it can be used in place of the currently dominating CIP magnetic detecting element.

In order to put the CPP magnetic detecting element into practical use to achieve a high density recording, the variation in resistance per unit area ($\Delta R \cdot A$) is desirably increased.

Japanese Unexamined Patent Application Publication No. 8-7235 has disclosed a technique for fixing the magnetization of a pinned magnetic layer by the uniaxial anisotropy of the pinned magnetic layer. The disadvantages of this technique will be described later.

Known CPP magnetic detecting elements have the following disadvantages.

FIG. 10 is a schematic diagram of the structure of a known CPP magnetic detecting element. The CPP magnetic detecting element includes a multilayer composite and electrodes 5 and 6 disposed on the top and the bottom of the multilayer composite. The multilayer composite includes nonmagnetic material layers 2, pinned magnetic layers 3, and antiferromagnetic layers 4 disposed in that order over and under a free magnetic layer 1.

In this structure, each pinned magnetic layer 3 is composed of three sublayers: two magnetic layers 3a and 3c and a nonmagnetic interlayer 3b between the magnetic layers 3a and 3c. The magnetic layers 3a and 3c are magnetized antiparallel to each other. Such a multilayer structure is called the artificial ferrimagnetic structure.

For example, the free magnetic layer 1 is formed of a NiFe alloy; the nonmagnetic material layer 2 is formed of Cu; the magnetic layers 3a and 3c of the pinned magnetic layer 3 are formed of a CoFe alloy and the nonmagnetic interlayer 3b is formed of Ru; and the antiferromagnetic layer 4 is formed of a PtMn alloy.

The antiferromagnetic layer 4 has a specific resistance as high as, for example, about 200 $\mu\Omega \cdot cm^2$ (or more), and generates Joule heat when a current is applied to the electrodes 5 and 6. The Joule heat causes lattice vibration of conduction electrons in the adjacent pinned magnetic layer 3, the nonmagnetic material layer 2, and the free magnetic layer 1, thereby making the phonon scattering and electromigration vigorous.

It is considered that the variation in resistance per unit area ($\Delta R \cdot A$) of the CPP magnetic detecting element is closely related to the spin-dependent bulk scattering effect. In the structure shown in FIG. 10, the variation in resistance ($\Delta R$) depends on the magnetic layer 3c adjoining the nonmagnetic material layer 2 among the free magnetic layer 1 and the layers constituting the pinned magnetic layer 3. In order to increase the $\Delta R \cdot A$ value, it is necessary that the difference in spin diffusion length between the up-spin conduction electrons and down-spin conduction electrons in the magnetic layer 3c be increased by setting the spin-dependent bulk scattering coefficient $\beta$ of the magnetic layer 3c to be positive so that, in the magnetic layer 3c, the up-spin conduction electrons can easily flow while the down-spin conduction electrons can be easily scattered.

However, it has been found that the above-mentioned lattice vibration of conduction electrons causes phonon scattering and electromigration to scatter the conduction electrons independently of the spin states, and that consequently the GMR effect of the CPP magnetic detecting element represented by the $\Delta R \cdot A$ value cannot be appropriately enhanced.

Furthermore, in the structure shown in FIG. 10, the presence of the thick antiferromagnetic layers 4 increases the gap between the electrodes 5 and 6. This makes it impossible to appropriately increase the recording density (more specifically, track recording density) of recording media.

One approach for enhancing the GMR effect of the CPP magnetic detecting element is to eliminate the antiferromagnetic layers 4 from the multilayer composite. In this instance, the magnetization of the pinned magnetic layers needs to be appropriately fixed without the antiferromagnetic layers.

The above-cited Japanese Unexamined Patent Application Publication No. 8-7235 has disclosed a technique for fixing the magnetization of a pinned magnetic layer by the uniaxial anisotropy of the pinned magnetic layer, without an antiferromagnetic layer.

However, the magnetic detecting element of this publication is of a CIP type, and there is no mention of how the magnetization of the pinned magnetic layer is fixed in a CPP magnetic detecting element. In addition, the pinned ferromagnetic layer (pinned magnetic layer) of this publication is deposited on a buffer layer made of tantalum, which is liable to turn amorphous and whose specific resistance is high. If such a buffer layer is used in a CPP magnetic detecting element, it probably generates heat as the known antiferromagnetic layer does, thereby causing conduction electrons to scatter independently of the spin states. Hence, the GMR effect cannot be enhanced. Furthermore, Japanese Unexamined Patent Application Publication No. 8-7235 has not clearly disclosed the principle of how the tantalum buffer layer firmly fixes the magnetization of the pinned ferromagnetic layer. Therefore, the structure of this publication cannot be directly applied for the structure of the CPP magnetic detecting element.

Probably, the GMR effect of the CIP magnetic detecting element is closely related to the spin-dependent interface scattering, unlike that of the CPP magnetic detecting element. If the structure of the interface between the nonmagnetic material layer and the pinned magnetic layer is changed in the CIP magnetic detecting element, there is a high risk of reducing the ΔR/R value. It should be avoided to change the interface structure in the CIP magnetic detecting element.

In general, the nonmagnetic material layer is formed of Cu and the magnetic layers of the pinned magnetic layer are formed of a CoFe alloy or the like, as described above. Since the Cu/CoFe interface produces an excellent spin-dependent interface scattering effect, it is impractical in the CIP magnetic detecting element that, for example, the nonmagnetic material layer is formed of a nonmagnetic metal other than Cu, or that the Cu/CoFe interface structure is modified into another structure.

In the CPP magnetic detecting element, on the other hand, the GMR effect is, probably, related to the spin-dependent bulk scattering rather than the spin-dependent interface scattering. The inventors of the present invention have thought that the CPP magnetic detecting element allows of modification of the interface structure between the nonmagnetic material layer 2 and the pinned magnetic layer 3 (magnetic layer 3c) shown in FIG. 10 for more firmly fixing the magnetization of the pinned magnetic layer 3, unlike the CIP magnetic detecting element.

SUMMARY OF THE INVENTION

The present invention has been made in view of the above circumstances, and provides a CPP magnetic detecting element having a structure which CIP magnetic detecting elements do not allow and in which the magnetization of the pinned magnetic layer is more firmly fixed by the uniaxial anisotropy of the pinned magnetic layer.

The magnetic detecting element of the present invention includes a multilayer composite constituted of a plurality of layers in which current flows in a direction perpendicular to the surfaces of the layers. The multilayer composite includes a free magnetic layer, a nonmagnetic material layer made of a nonmagnetic metal having a lattice constant higher than that of Cu, a pinned magnetic layer including a plurality of magnetic layers and at least one nonmagnetic interlayer separating the magnetic layers from one another. The magnetic layer located most distant from the nonmagnetic material layer is defined as a first magnetic layer and the magnetic layer located closest to the nonmagnetic material layer is defined as a second magnetic layer. The second magnetic layer is in contact with the nonmagnetic material layer. The multilayer composite also includes a magnetostriction-enhancing layer made of a nonmagnetic metal, disposed on the surface opposite to the nonmagnetic material layer of the first magnetic layer. The upper surface and the lower surface of the pinned magnetic layer lie between the magnetostriction-enhancing layer and the nonmagnetic material layer. At least part of crystals in the magnetostriction-enhancing layer and the first magnetic layer and at least part of crystals in the nonmagnetic material layer and the second magnetic layer are present in an epitaxial state or a heteroepitaxial state. The surface opposing a recording medium of the pinned magnetic layer is open.

The magnetic detecting element of the present invention is a so-called self-pinned CPP magnetic detecting element in which the magnetization of the pinned magnetic layer is fixed by the uniaxial anisotropy of the pinned magnetic layer itself.

The CPP magnetic detecting element does not have an antiferromagnetic layer having a high specific resistance. Thus, it can prevent spin-independent scattering of conduction electrons caused by heat generation, and enhance the GMR effect represented by the variation in resistance per unit area (ΔR·A), in comparison with the known CPP magnetic detecting element having a thick antiferromagnetic layer. Consequently, the reliability in energization can be increased. In addition, since the distance between shield layers disposed at the top and bottom of the CPP magnetic detecting element can be reduced, the CPP magnetic detecting element can be used for high track density recording on media.

The magnetic anisotropic field of a ferromagnetic layer depends on magnetocrystalline anisotropy, induced magnetic anisotropy, and magnetoelasticity. The present invention focuses on the magnetoelasticity, which determines the uniaxial anisotropy fixing the magnetization of the pinned magnetic layer.

The magnetoelasticity depends on magnetoelastic energy. The magnetoelastic energy is defined by the stress placed on the pinned magnetic layer and the magnetostriction coefficient λs of the pinned magnetic layer.

The side surface opposing the recording medium of the pinned magnetic layer is open and free from any component so that the symmetry of the stress is distorted. Thus, the pinned magnetic layer is subjected to a tensile stress in the direction of the height of the element (height direction, direction of the normal to the recording medium-opposing surface). The present invention increases the magnetostriction coefficient λs of the pinned magnetic layer to increase the magnetoelastic energy, thereby increasing the uniaxial anisotropy of the pinned magnetic layer. A large uniaxial anisotropy of the pinned magnetic layer can firmly fix the magnetization of the pinned magnetic layer in a specific direction. Consequently, the power of the magnetic detecting element is increased and the reliability and symmetry of the power are enhanced.

The pinned magnetic layer has an artificial ferrimagnetic structure including a plurality of magnetic layers separated by the nonmagnetic interlayer.

The magnetic layer located most distant from the nonmagnetic material layer, or the first magnetic layer, is provided with the nonmagnetic metal magnetostriction-enhancing layer on its surface opposite to the nonmagnetic material layer, in contact with each other. The first magnetic layer and the magnetostriction-enhancing layer are epitaxially or heteroepitaxially joined together, so that the crystal structure of the first magnetic layer is distorted to increase the magnetostriction coefficient λs of the first magnetic layer.

In the present invention, the second magnetic layer disposed closest to the nonmagnetic material layer is in contact with the nonmagnetic material layer, and the nonmagnetic material layer is formed of a nonmagnetic metal having a lattice constant higher than that of Cu.

The second magnetic layer and the nonmagnetic material layer are epitaxially or heteroepitaxially joined together, so that the crystal structure of the second magnetic layer is distorted to increase the magnetostriction coefficient λs of the second magnetic layer.

In the structure of the present invention, the upper and lower surfaces of the pinned magnetic layer lie between the magnetostriction-enhancing layer and the nonmagnetic material layer having a lattice constant higher than that of Cu, so that the magnetostriction coefficient of the pinned magnetic layer is increased from above and below.

The magnetic detecting element of the present invention is of a CPP type, which includes a multilayer composite constituted of a free magnetic layer, a nonmagnetic material layer, and a pinned magnetic layer in which current flows in the direction perpendicular to the surfaces of the layers. In CPP magnetic detecting elements, spin-dependent bulk scattering in the ferromagnetic layer plays an important role in increasing the variation in resistance per unit area ($\Delta R \cdot A$). Even if the nonmagnetic material layer is formed of a material other than normally used Cu, the $\Delta R \cdot A$ value is less reduced.

On the other hand, in CIP (current-in-the-plane) magnetic detecting elements in which current flows parallel to the surfaced of the layers of the multilayer composite, the spin-dependent interface scattering largely affects the. $\Delta R/R$ value. If the nonmagnetic material layer is formed of a material other than Cu, the $\Delta R/R$ value is extremely reduced.

It is possible that the upper and lower surfaces of the pinned magnetic layer are disposed between the nonmagnetic metal magnetostriction-enhancing layer and the magnetic material layer having a lattice constant higher than that of Cu without reducing the $\Delta R \cdot A$ value, as long as the magnetic detecting element is of the CPP type. Thus, the magnetostriction coefficient of the pinned magnetic layer is increased from above and below to produce magnetoelasticity appropriately. The magnetization of the pinned magnetic layer is more firmly fixed. Consequently, magnetization of the pinned magnetic layer cannot be distorted by a longitudinal bias magnetic field from a hard bias layer, and accordingly the distortion and asymmetry of reproduction waveforms resulting from the fluctuations of the magnetization can be reduced. Also, the pinned magnetic layer is prevented from being reversed by electrostatic discharge. Thus, the performance and reliability of the resulting magnetic head can be enhanced.

Preferably, the nonmagnetic material layer is formed of a Cu—X alloy, wherein X represents at least one element selected from the group consisting of Pt, Au, Pd, Ag, Ir, Rh, Ga, Ge, As, Sb, Sn, Zn, B, C, N, Al, Si, and P. Although these elements have larger atomic radiuses than Cu, they can increase the lattice constant of the Cu—X alloy because they can be interstitial solid solution.

The nonmagnetic material layer made of the Cu—X alloy has a higher lattice constant than Cu.

Preferably, the interface between the nonmagnetic material layer and the second magnetic layer has a positive spin-dependent interface scattering coefficient. In order to set the spin-dependent interface scattering coefficient to be positive, X of the Cu—X alloy is preferably at least one element selected from the group consisting of Pt, Au, Pd, Ag, Ir, and Rh.

Preferably, the Cu content in the nonmagnetic material layer is in the range of 50 to 99 atomic percent and the balance is X. The nonmagnetic material layer principally made of Cu increases the variation in resistance per unit area ($\Delta R \cdot A$).

Preferably, the nonmagnetic material layer is formed by sputtering. For example, if Ag is used as X, Ag has a low miscibility with Cu in equilibrium, and Ag and Cu are not mixed well accordingly. Hence, they do not easily form solid solution. In this case, the nonmagnetic material layer does not have a higher lattice constant than Cu nor serve as a magnetostriction-enhancing layer to increase the lattice constant of the second magnetic layer.

However, sputtering of the nonmagnetic material layer at a high deposition energy helps Ag uniformly mix with Cu to form a supersaturated solid solution in nonequilibrium, even if Ag is used as X. Consequently, the entire nonmagnetic material layer can be formed of a material having a lattice constant higher than that of Cu.

Preferably, the second magnetic layer has a positive spin-dependent bulk scattering coefficient.

The spin-dependent bulk scattering coefficient $\beta$ depends on the magnetic material. In the present invention, the second magnetic layer is formed of a magnetic material leading to a positive spin-dependent bulk scattering coefficient $\beta$.

Specifically, at least part of the second magnetic layer may be formed of a Heusler alloy expressed by $Co_2MnY$ (Y represents at least one element selected from the group consisting of Al, Si, Ga, Ge, and Sn), or a magnetic material selected from the group consisting of Co, CoFe, Co-Z, CoFe-Z (Z represents at least one element selected from the group consisting of Ti, Zr, Ta, Hf, Sc, V, Mn, Y, and Nb), and Ni-Q (Q represents at least one element selected from the group consisting of Rh, Ir, Be, Al, Si, Ga, Ge, Ti, Mn, Zn, Cd, and Sn).

The spin-dependent bulk scattering coefficient $\beta$ satisfies the relationship $\rho\downarrow/\rho\uparrow=(1+\beta)/(1-\beta)$, wherein $\rho\downarrow$ represents specific resistance to down-spin conduction electrons and $\rho\uparrow$ represents specific resistance to up-spin conduction electrons. $\beta$ is in the range of more than −1 to less than 1.

If the second magnetic layer is formed of a magnetic material leasing to a positive $\beta$ value, the relationship $\rho\downarrow>\rho\uparrow$ holds.

When the $\beta$ value is positive, the specific resistance $\rho\downarrow$ to down-spin conduction electrons increases, so that it becomes difficult for the down-spin conduction electrons to flow in the second magnetic layer or the down-spin conduction electrons are blocked out. Consequently, the spin diffusion length of the down-spin conduction electrons is reduced. On the other hand, the specific resistance $\rho\uparrow$ to up-spin conduction electrons decreases, so that it becomes easy for the up-spin conduction electrons to flow in the second magnetic layer. Consequently, the spin diffusion length of the up-spin conduction electrons is increased. Thus, the difference in spin diffusion length between the up-spin conduction electrons and the down-spin conduction electrons can be increased. By use of a magnetic material having a large $\beta$ value for the second magnetic layer, the difference in spin diffusion length can be increased to increase the $\Delta R \cdot A$ value more appropriately.

When the interface between the nonmagnetic material layer and the second magnetic layer has a positive spin-dependent interface scattering coefficient $\gamma$, as described above, up-spin conduction electrons easily flow at the interface, but down-spin conduction electrons does not. Thus, the variation in resistance per unit area ($\Delta R \cdot A$) can be further increased.

It is considered that the use of the Cu—X alloy for the nonmagnetic material layer reduces the spin-dependent interface scattering coefficient $\gamma$ in comparison with the use of Cu. In CPP magnetic detecting elements, however, spin-dependent bulk scattering is probably most important in increasing the $\Delta R \cdot A$ value. Even if the spin-dependent interface scattering effect is degraded to some extent, the $\Delta R \cdot A$ value does not decrease much.

The nonmagnetic material layer made of a material other than Cu degrades the GMR effect to some extent even in the CPP magnetic detecting element. However, the GMR effect represented by the rate of change in resistance does not degrade so rapidly as that of the CIP magnetic detecting element. In particular, the structure of the present invention, from which the antiferromagnetic layer is eliminated, enhances the GMR effect more effectively than the structure having an antiferromagnetic layer of the CPP magnetic detecting element shown in FIG. 10. Accordingly, the structure of the present invention produces a sufficiently high GMR effect in comparison with the magnetic detecting element shown in FIG. 10, even though the nonmagnetic material layer is formed of the Cu—X alloy.

The present invention enhances the GMR effect by eliminating the antiferromagnetic layer. In order to fix the magnetization of the pinned magnetic layer appropriately, the approach is not sufficient in which the first magnetic layer of the pinned magnetic layer is joined together with the magnetostriction-enhancing layer to increase the magnetostriction coefficient of the first magnetic layer. This is because the magnetostriction coefficient of the second magnetic layer is not very high. Accordingly, the nonmagnetic material layer is formed of a nonmagnetic metal having a lattice constant higher than that of Cu to increase the magnetostriction coefficient of the second magnetic layer appropriately, thereby more firmly fixing the magnetization of the pinned magnetic layer with the GMR effect maintained, in view of the fact that spin-dependent interface scattering is less important for the GMR effect of the CPP magnetic detecting element than of the CIP magnetic detecting element.

Preferably, the magnetostriction-enhancing layer is formed of an X—Mn alloy, wherein X represents at least one element selected from the group consisting of Pt, Pd, Ir, Rh, Ru, Os, Ni, and Fe.

Preferably, the magnetostriction-enhancing layer has a face-centered cubic (fcc) structure in its entirety or in the vicinity of the interface with the first magnetic layer, and the nonmagnetic material layer has an fcc structure in its entirety or in the vicinity of the interface with the second magnetic layer. Equivalent crystal planes represented by {111} in the fcc structure are preferentially oriented in the direction parallel to the interfaces.

Preferably, the first magnetic layer has an fcc structure in its entirety or in the vicinity of the interface with the magnetostriction-enhancing layer and/or the second magnetic layer has an fcc structure in its entirety or in the vicinity of the interface with the nonmagnetic material layer. Equivalent crystal planes represented by {111} in the fcc structure are preferentially oriented in the direction parallel to the corresponding interface.

For example, the magnetostriction-enhancing layer and the nonmagnetic material layer have an fcc structure, and {111} equivalent crystal planes in the fcc structure are preferentially oriented in the direction parallel to the interfaces.

This structure allows the atoms constituting the first magnetic layer and the magnetostriction-enhancing layer and/or the atoms constituting the second magnetic layer and the nonmagnetic material layer to align readily in such a manner as to be stacked on top of one another.

Alternatively, the first magnetic layer may have a body-centered cubic (bcc) structure in its entirety or in the vicinity of the interface with the magnetostriction-enhancing layer and/or the second magnetic layer may have a bcc structure in its entirety or in the vicinity of the interface with the nonmagnetic material layer, and equivalent crystal planes represented by {110} in the bcc structure are preferentially oriented in the direction parallel to the corresponding interface.

Even if the first magnetic layer and/or second magnetic layer has a bcc structure and its {110} equivalent crystal planes are preferentially oriented in the direction parallel to the corresponding interface, the atoms constituting the first magnetic layer and the magnetostriction-enhancing layer and/or the atoms constituting the second magnetic layer and the nonmagnetic material layer are readily aligned in such a manner as to be stacked on top of one another.

In the CPP magnetic detecting element of the present invention, the upper and lower surfaces of the pinned magnetic layer having an artificial ferrimagnetic structure lie between the nonmagnetic metal magnetostriction-enhancing layer and the nonmagnetic material layer having a lattice constant higher than that of Cu.

Since the magnetic detecting element of the present invention is of a CPP type, the nonmagnetic material layer between the pinned magnetic layer and the free magnetic layer can be formed of a material other than Cu without largely reducing the ΔR·A value.

The CPP structure in a magnetic detecting element allow the upper and lower surfaces of the pinned magnetic layer to lie between a nonmagnetic metal magnetostriction-enhancing layer and a nonmagnetic material layer having a lattice constant higher than that of Cu, without reducing the ΔR·A value. Consequently, the magnetostriction coefficient of the pinned magnetic layer is increased from above and blow to produce appropriate magnetoelasticity, and the magnetization of the pinned magnetic layer is more firmly fixed. Consequently, magnetization of the pinned magnetic layer is not distorted by a longitudinal bias magnetic field from a hard bias layer, and accordingly the distortion and asymmetry of reproduction waveforms resulting from the fluctuations of the magnetization can be reduced. Also, the pinned magnetic layer is prevented from being reversed by electrostatic discharge. Thus, the performance and reliability of the resulting magnetic head can be enhanced.

BRIEF DESCRIPTION OF THE DRAWINGS

FIG. 10 is a schematic fragmentary diagram of a known CPP magnetic detecting element viewed from a surface opposing a recording medium.

DESCRIPTION OF THE PREFERRED EMBODIMENTS

Figure 1:
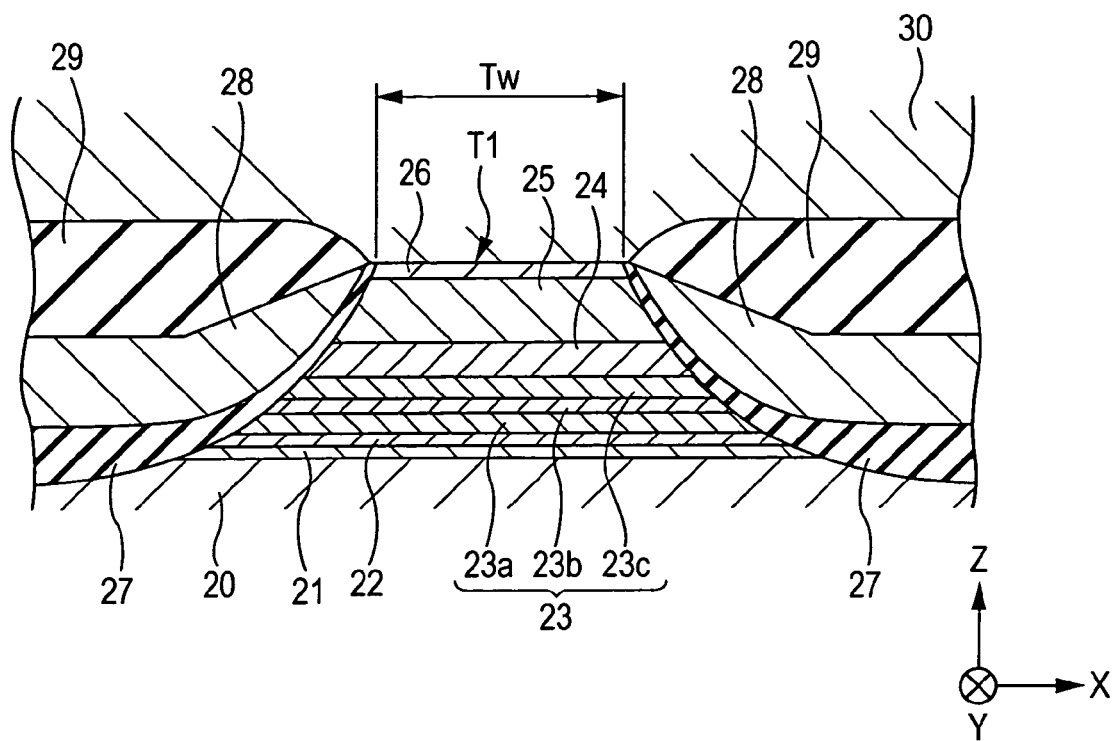
FIG. 1 is a sectional view of a magnetic detecting element according to a first embodiment of the present invention, viewed from a surface opposing a recording medium.
Figure 4:
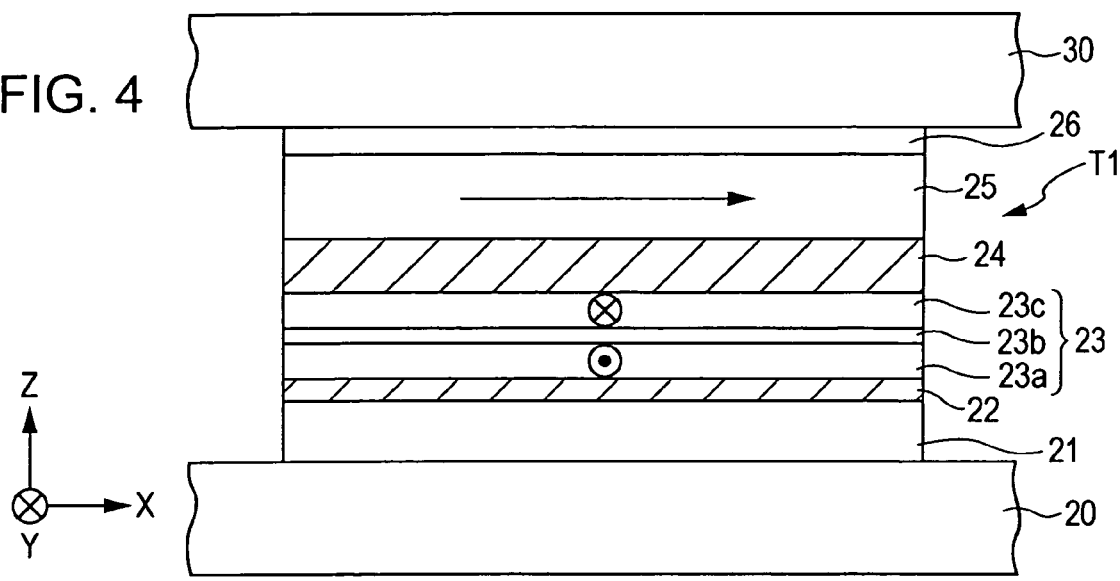
FIG. 4 is a schematic fragmentary diagram of the magnetic detecting element shown in FIG. 1.

FIG. 1 is a sectional view of a magnetic detecting element according to a first embodiment of the present invention, viewed from the side surface opposing the recording medium, and FIG. 4 is a fragmentary schematic diagram of the magnetic detecting element shown in FIG. 1.

The magnetic detecting element shown in FIGS. 1 and 4 has a multilayer composite T1 on a lower shield layer 20 made of a magnetic material.

The multilayer composite T1 is formed by depositing a seed layer 21, a magnetostriction-enhancing layer 22, a pinned magnetic layer 23, a nonmagnetic material layer 24, a free magnetic layer 25, and a protective layer 26 in that order on the shield layer 20.

The seed layer 21 is formed of a NiFe alloy, a NiFeCr alloy, Cr, Ta, or the like. For example, the seed layer 21 is formed of 60 atomic percent of $Ni_{0.8}Fe_{0.2}$ and 40 atomic percent of Cr to a thickness of 35 to 60 Å.

The seed layer 21 helps the magnetostriction-enhancing layer 22, which is formed of a nonmagnetic metal, have good {111} orientation.

The magnetostriction-enhancing layer 22 will be described later.

The pinned magnetic layer 23 has an artificial ferrimagnetic structure including a first magnetic layer 23a and a second magnetic layer 23c separated by a nonmagnetic interlayer 23b made of, for example, Ru. The magnetization of the pinned magnetic layer 23 is fixed in the height direction (Y direction of the figure) by the uniaxial anisotropy of the pinned magnetic layer 23 itself.

The nonmagnetic material layer 24 disposed on the second magnetic layer 23c will be described later.

The free magnetic layer 25 is formed of a magnetic material, such as a NiFe alloy or a CoFe alloy. In the structure shown in FIG. 1, if the free magnetic layer 25 is formed of a NiFe alloy, a diffusion-preventing layer (not shown) made of Co, a CoFe alloy, or the like is preferably provided between the free magnetic layer 25 and the nonmagnetic material layer 24. The thickness of the free magnetic layer 25 is 20 to 100 Å. The free magnetic layer 25 may have an artificial ferrimagnetic structure constituted of a plurality of magnetic layers, each separated by a nonmagnetic interlayer.

The protective layer 26 is formed of, for example, Ta or Ru, to a thickness of about 10 to 50 Å, and prevents the multilayer composite T1 from oxidizing.

In the first embodiment, a lower insulating layer 27, a hard bias layer 28, and an upper insulating layer 29 are deposited in that order at both sides of the multilayer composite T1 from the seed layer 21 to the protective layer 26, as shown in FIG. 1. A longitudinal bias magnetic field from the hard bias layer 28 orients the magnetization of the free magnetic layer 25 in the direction of the track width Tw (X direction in the figure).

A bias underlayer (not shown) may be provided between the lower insulating layer 27 and the hard bias layer 28. The bias underlayer is formed of, for example, Cr, W, a W—Ti alloy, or an Fe—Cr alloy.

The insulating layers 27 and 29 are formed of an insulating material, such as $Al_2O_3$ or $SiO_2$, and isolate the upper and lower surfaces of the hard bias layer 28 so as to prevent the current flowing perpendicular to the surfaces of the layers in the multilayer composite T1 from diverging to both sides of the track width direction.

The hard bias layer 28 is formed of, for example, a Co—Pt alloy or a Co—Cr—Pt alloy.

An upper shield layer 30 made of a magnetic material is deposited over the upper insulating layers 29 and the protective layer 26. The magnetic detecting element shown in FIGS. 1 and 4 is of a CPP type, and in which the lower shield layer 20 and the upper shield layer 30 serve as electrodes that supply the current flowing perpendicular to the surfaces of the layers in the multilayer composite T1.

The magnetization of the free magnetic layer 25 is oriented in the track width direction (X direction) by the longitudinal bias magnetic field from the hard bias layer 28, and the direction is sensitively changed according to the signal magnetic field (external magnetic field) of the recording medium. On the other hand, the magnetization of the pinned magnetic layer 23 is fixed in the height direction (Y direction).

The electrical resistance depends on the relationship in direction between the magnetization of the free magnetic layer 25 and the fixed magnetization of the pinned magnetic layer 23 (particularly the fixed magnetization of the second magnetic layer 23c). The leak magnetic field from the recording medium is detected by changes in voltage or current according to changes in electrical resistance.

The magnetic detecting element according to the first embodiment features the following:

The pinned magnetic layer 23 of the magnetic detecting element shown in FIG. 1 has an artificial ferrimagnetic structure including the first magnetic layer 23a and the second magnetic layer 23c separated by the nonmagnetic interlayer 23b made of Ru or the like. The first magnetic layer 23a and the second magnetic layer 23c are magnetized in directions antiparallel to each other by the Ruderman-Kittel-Kasuya-Yosida (RKKY) interaction with the nonmagnetic interlayer 23b disposed between the magnetic layers.

The first magnetic layer 23a lies most distant from the nonmagnetic material layer 24 in the magnetic layers of the pinned magnetic layer 23, and the nonmagnetic metal magnetostriction-enhancing layer 22 is directly disposed on the surface opposite to the nonmagnetic material layer 24 of the first magnetic layer 23a.

The second magnetic layer 23c lies closest to the nonmagnetic material layer 24 in the magnetic layers of the pinned magnetic layer 23, and is in contact with the nonmagnetic material layer 24.

The nonmagnetic material layer 24 is formed of a nonmagnetic metal having a larger lattice constant than Cu.

The upper and lower surfaces of the pinned magnetic layer 23 lie between the magnetostriction-enhancing layer 22 and the nonmagnetic material layer 24, as shown in FIGS. 1 and 4 (in FIG. 4, the magnetostriction-enhancing layer 22 and the nonmagnetic material layer 24 are indicated by oblique lines).

The first embodiment involves the magnetoelasticity that determines the uniaxial anisotropy fixing the magnetization of the pinned magnetic layer 23.

The magnetoelasticity is controlled by magnetoelastic energy. The magnetoelastic energy is defined by the stress a placed on the pinned magnetic layer 23 and the magnetostriction coefficient λs of the pinned magnetic layer 23.

Figure 2:
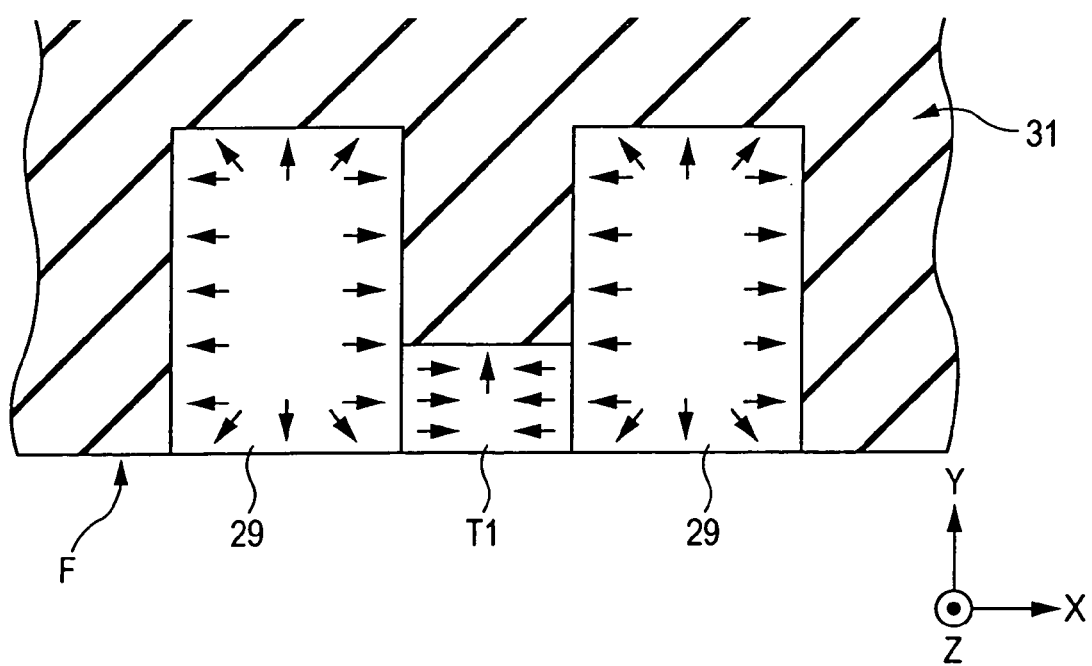
FIG. 2 is a plan view of the magnetic detecting element shown in FIG. 1.

FIG. 2 is a plan view of the magnetic detecting element shown in FIG. 1 when viewed from above (direction opposite to the Z direction). The multilayer composite T1 of the magnetic detecting element is disposed between a pair of units, each including the lower insulating layer 27, the hard bias layer 28, and the upper insulating layer 29. Since the lower insulating layer 27 and the hard bias layer 28 underlie the upper insulating layer 29, they are not shown in FIG. 2. The external region of the multilayer composite T1 and the two units including the lower insulating layer 27, the hard bias layer 28, and the upper insulating layer 29 are filled with another insulating layer 31 indicated by oblique lines.

The surface F opposing the recording medium, defined by ends of the multilayer composite T1, lower insulating layer 27, hard bias layer 28, and upper insulating layer 29 is exposed or covered with a thin protective layer made of, for example, diamond-like carbon (DLC) with a thickness of about 20 to 50 Å, and is open.

Consequently, the symmetry of the stress from the lower shield layer 20 and the upper shield layer 30, which is two-dimensionally isotropic originally, is distorted due to the open end surface F. As a result, a tensile stress is placed on the multilayer composite T1 in the height direction (Y direction). If the multilayer units including the lower insulating layer 27, the hard bias layer 28, and the upper insulating layer 29 have an internal compressive stress, the insulating layers 27 and 29 tend to extend in the in-plane direction, and a compressive stress is placed on the multilayer composite T1 in the directions parallel and antiparallel to the track width direction (X direction).

More specifically, a tensile stress in the height direction (Y direction) and a compressive stress in the track width direction (X direction) are applied to the pinned magnetic layer 23 having the open end surface F opposing the recording medium. The easy magnetization axes of the first magnetic layer 23a and the second magnetic layer 23c, which are formed of a magnetic material having a positive magnetostriction coefficient $\lambda s$, are pointed to the back of the magnetic detecting element (in the height direction or Y direction) by the magnetoelasticity, so that the magnetizations of the first magnetic layer 23a and the second magnetic layer 23c are fixed in the direction parallel or antiparallel to the height direction. The RKKY interaction acting between the first magnetic layer 23a and the second magnetic layer 23c fixes the magnetization directions of the first magnetic layer 23a and the second magnetic layer 23c in antiparallel with each other.

In the present embodiment, the magnetostriction coefficient $\lambda s$ of the pinned magnetic layer 23 is set large to increase magnetoelastic energy so that the uniaxial anisotropy of the pinned magnetic layer 23 is increased. A larger uniaxial anisotropy of the pinned magnetic layer 23 can more firmly fix the magnetization of the pinned magnetic layer 23 in a specific direction. Thus, the power of the magnetic detecting element is increased with enhanced power stability and symmetry.

More specifically, the magnetostriction coefficients As of the first magnetic layer 23a and the second magnetic layer 23c of the pinned magnetic layer 23 are increased by joining the first magnetic layer 23a to the magnetostriction-enhancing layer 22, and the second magnetic layer 23c to the nonmagnetic material layer 24 having a lattice constant higher than that of Cu so that the crystal structures of the first magnetic layer 23a and the second magnetic layer 23c are distorted.

The nonmagnetic material layer 24 has a higher lattice constant than the second magnetic layer 23c as a matter of course, and it serves as a magnetostriction-enhancing layer.

By disposing the upper and lower surfaces of the pinned magnetic layer 23 between the magnetostriction-enhancing layer 22 and the nonmagnetic material layer 24 having a higher lattice constant than Cu, as shown in FIGS. 1 and 4, the magnetostriction coefficients $\lambda s$ of both the first magnetic layer 23a and the second magnetic layer 23c can be appropriately increased. Thus, the magnetization of the entire pinned magnetic layer 23 can be firmly fixed.

Since Cu constituting the nonmagnetic material layer 24 has a lattice constant very close to that of the material constituting the second magnetic layer 23c, such as Co or a CoFe alloy, a nonmagnetic material layer 24 made of Cu hardly enhances the magnetostriction of the second magnetic layer 23c. It has been thus difficult to enhance the magnetostriction of the second magnetic layer 23c as in the first magnetic layer 23a in contact with the magnetostriction-enhancing layer 22.

In the present invention, however, the nonmagnetic material layer 24 is formed of a nonmagnetic metal having a lattice constant higher than that of Cu to increase the difference in lattice constant between the nonmagnetic material layer 24 and the second magnetic layer 23c, thereby appropriately enhancing the magnetostriction of the second magnetic layer 23c, as in the first magnetic layer 23a in contact with the magnetostriction-enhancing layer 22.

In the present invention, the nonmagnetic material layer 24 is formed of a nonmagnetic metal having a lattice constant higher than that of Cu. The CPP type among magnetic detecting elements allows this structure.

In CIP magnetic detecting elements, the GMR effect is closely related to spin-dependent interface scattering between the layers of the second magnetic layer/nonmagnetic material layer/free magnetic layer structure, and, in general, the material of each layer of the second magnetic layer/nonmagnetic material layer/free magnetic layer structure is selected so as to increase the spin-dependent interface scattering effect. For example, the second magnetic layer is formed of a CoFe alloy; the nonmagnetic material layer is formed of Cu; the free magnetic layer is formed with two layers formed of a CoFe alloy and a NiFe alloy (the CoFe alloy layer is disposed at the nonmagnetic material layer side). In this instance, the spin-dependent interface scattering effect between the CoFe layer and the Cu layer is greatly high. If the nonmagnetic material layer is formed of a nonmagnetic metal other than Cu, the spin-dependent interface scattering effect is rapidly reduced to degrade the GMR effect extremely.

It is therefore unsuitable for the CIP magnetic detecting element that the nonmagnetic material layer is formed of a nonmagnetic metal other than Cu, in view of the connection with the GMR effect.

For the CPP magnetic detecting element, although the spin-dependent interface scattering effect is a factor in increasing the GMR effect represented by the variation in resistance per unit area ($\Delta R \cdot A$), the spin-dependent bulk scattering effect is more important.

Spin-dependent bulk scattering occurs inside a ferromagnetic layer, and is closely associated with how far conduction electrons run without changing their spins, that is, the spin diffusion length.

In the CPP magnetic detecting element according to the present invention, the nonmagnetic material layer 24 in contact with the second magnetic layer 23c, formed of a nonmagnetic metal other than Cu degrades the spin-dependent interface scattering effect, but produces an appropriate spin-dependent bulk scattering effect. Hence, the nonmagnetic material layer 24 does not rapidly degrade the GMR effect, in comparison with the CIP magnetic detecting element.

The structure having the nonmagnetic material layer 24 made of a nonmagnetic metal other than Cu, as shown in FIG. 1, is applicable only in CPP magnetic detecting elements.

Preferably, the magnetostriction-enhancing layer 22, the nonmagnetic material layer 24, the first magnetic layer 23a, and the second magnetic layer 23c all have face-centered cubic lattice (fcc) structures, and their equivalent crystal planes represented by {111} are preferentially oriented in the direction parallel to their interfaces, from the viewpoint of enhancing the crystallinity. In this instance, the mismatch values is preferably set in the range of 0.05 to 0.20 which are defined by dividing the difference between the minimum interatomic distances in the {111} planes of the magnetostriction-enhancing layer 22 and the first magnetic layer 23a by the minimum interatomic distance in the {111} plane of the first magnetic layer 23a or dividing the difference between the minimum interatomic distances in the {111} planes of the nonmagnetic material layer 24 and the second magnetic layer 23c by the minimum interatomic distance in the {111} plane of the second magnetic layer 23c.

Figure 3:
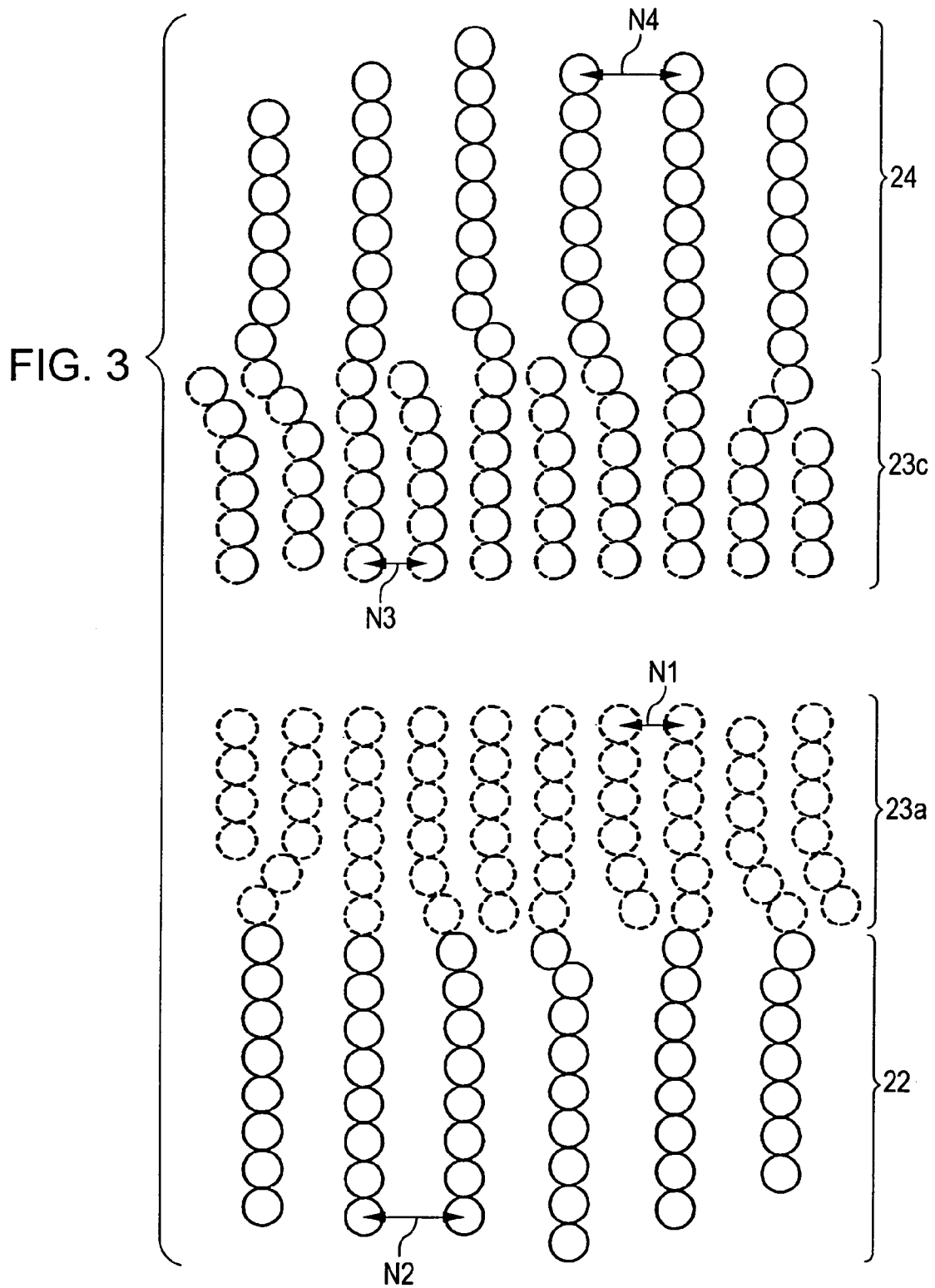
FIG. 3 is a schematic diagram of a state where distortion occurs in a magnetostriction-enhancing layer and a first magnetic layer of a pinned magnetic layer, and in a nonmagnetic material layer and a second magnetic layer of the pinned magnetic layer, with matching.

In the magnetic detecting element of the present embodiment, the atoms constituting the magnetostriction-enhancing layer 22 and first magnetic layer 23a, and the atoms constituting the nonmagnetic material layer 24 and the second magnetic layer 23c are stacked on top of one another with the crystal structure distorted at the interface, as shown in FIG. 3.

Reference marks N1 and N3 in FIG. 3 represent the minimum interatomic distances in the {111} plane of the first magnetic layer 23a and the second magnetic layer 23c, respectively, and reference marks N2 and N4 represent the minimum interatomic distances in the {111} plane of the magnetostriction-enhancing layer 22 and the nonmagnetic material layer 24, respectively. N1, N2, N3, and N4 are each measured at a position not affected by the distortion, distant from the interface between the magnetostriction-enhancing layer 22 and the first magnetic layer 23a or between the nonmagnetic material layer 24 and the second magnetic layer 23c.

At least part of the crystals in the magnetostriction-enhancing layer 22 and first magnetic layer 23a and at least part of the crystals in the nonmagnetic material layer 24 and second magnetic layer 23c grow epitaxially, as shown in FIG. 3. Consequently, the crystal structures of the first magnetic layer 23a and the second magnetic layer 23C are distorted, thereby increasing the magnetostriction coefficients λs of the first magnetic layer 23a and the second magnetic layer 23c.

In the present invention, it suffices that most of the atoms constituting the first magnetic layer 23a and magnetostriction-enhancing layer 22 in the vicinity of their interface are in correct alignment in such a manner as to be stacked on top of one another, and that most of the atoms constituting the second magnetic layer 23c and nonmagnetic material layer 24 in the vicinity of their interface are in such correct alignment. For example, some of the atoms in the vicinity of the interfaces may not be aligned, as shown in FIG. 3. A few of the crystal grains constituting a polycrystal may be in a non-epitaxial misalignment.

The material of the nonmagnetic material layer 24 will now be described.

The nonmagnetic material layer 24 needs to have a higher lattice constant than that of Cu, and the lattice constant is also higher than that of the second magnetic layer 23c, from the viewpoint of enhancing the magnetostriction of the second magnetic layer 23c.

Accordingly, the material of the nonmagnetic material layer is selected from the nonmagnetic metals having a higher lattice constant than Cu and the second magnetic layer 23c.

The second magnetic layer 23c is formed of a Co-base alloy, a Ni-based alloy, a Heusler alloy, or the like. In order to have a higher lattice constant than the nonmagnetic material constituting the second magnetic layer 23c and Cu, the nonmagnetic material layer 24 is preferably formed of a Cu—X alloy, wherein X represents at least one element selected from the group consisting of Pt, Au, Pd, Ag, Ir, Rh, Ga, Ge, As, Sb, Sn, Zn, B, C, N, Si, Al, and P.

The Cu—X alloy has a higher lattice constant than the second magnetic layer 23c and Cu.

In the CPP magnetic detecting element shown in FIG. 1, spin-dependent bulk scattering plays an important role in the GMR effect. The spin-dependent bulk scattering coefficient (β value) of the second magnetic layer 23c, which contributes to the GMR effect, is preferably positive.

Magnetic materials leading to positive spin-dependent bulk scattering coefficients (β) include Co, CoFe, Co-Z, CoFe-Z (Z represents at least one element selected from the group consisting of Ti, Zr, Ta, Hf, Sc, V, Mn, Y, and Nb), and Ni-Q (Q represents at least one element selected from the group consisting of Rh, Ir, Be, Al, Si, Ga, Ge, Ti, Mn, Zn, Cd, and Sn).

These magnetic materials may be used for the first magnetic layer 23a of the pinned magnetic layer 23.

More preferably, the second magnetic layer 23c is formed of a Heusler alloy having a composition of $CO_2MnY$ (Y represents at least one element selected from the group consisting of Al, Si, Ga, Ge, and Sn).

The Heusler alloy has a positive spin-dependent bulk scattering coefficient β, and this value is relatively high (specifically, 0.7 or more). For the spin-dependent bulk scattering coefficient β, the relationship $\rho\downarrow/\rho\uparrow=(1+\beta)/(1-\beta)$ holds, wherein $\rho\downarrow$ represents the specific resistance to down-spin conduction electrons and $\rho\uparrow$ represents the specific resistance to up-spin conduction electrons.

A positive spin-dependent bulk scattering coefficient β results in a positive $\rho\downarrow/\rho\uparrow$, and hence leads to a relationship $\rho\downarrow>\rho\uparrow$. It becomes difficult for the down-spin conduction electrons to flow in the ferromagnetic layer, or they are blocked out. Consequently, the mean free path and spin diffusion length of the down-spin conduction electrons are reduced to show an insulated behavior. In contrast, it becomes easy for the up-spin conduction electrons to flow, and their mean free path and spin diffusion length are increased to show a metallic behavior. The differences in mean free path and spin diffusion length between the up-spin conduction electrons and the down-spin conduction electrons are increased. This phenomenon is called spin polarization. A Heusler alloy having a high β value allows strong spin polarization and further increases the differences in mean free path and spin diffusion length.

The variation in resistance per unit area (ΔR·A) has a positive correlation with the difference in spin diffusion length between the up-spin and down-spin conduction electrons. By increasing the spin-dependent bulk scattering coefficient β to increase the difference of the spin diffusion lengths, the ΔR·A value can be increased. Thus, the resulting magnetic detecting element can be applied for high-density recording.

If the second magnetic layer 23c is formed of a magnetic material leading to a positive spin-dependent bulk scattering coefficient β, it is preferable that the spin-dependent interface scattering coefficient γ between the second magnetic layer 23*c* and the nonmagnetic material layer 24 be positive.

Accordingly, it is preferable that the nonmagnetic material layer 24 be formed of a nonmagnetic metal having a larger lattice constant than the lattice constants of the second magnetic layer 23*c* and Cu, and leading to a positive spin-dependent interface scattering coefficient γ at the interface with the second magnetic layer 23*c*.

Specifically, the nonmagnetic material layer 24 is preferably formed of a Cu—X alloy, wherein X represents at least one element selected from the group consisting of Pt, Au, Pd, Ag, Ir, and Rh. Thus, the spin-dependent interface scattering coefficient γ between the nonmagnetic material layer 24 and the second magnetic layer 23*c* can be set positive.

Preferably, the cu content in the nonmagnetic material layer 24 is in the range of 50 to 99 atomic percent, and the balance is X.

The most importance of the present invention is that the nonmagnetic material layer 24 is formed of a nonmagnetic metal having a higher lattice constant than Cu; hence, the nonmagnetic material layer 24 may be formed of a Cu-free nonmagnetic metal.

It is however preferable that the nonmagnetic material layer 24 be formed of a Cu-based Cu—X alloy so as to have a spin-dependent interface scattering coefficient γ lower than that of a Cu nonmagnetic material layer 24, to result in smaller decrease in spin-dependent interface scattering coefficient γ than the Cu nonmagnetic material layer 24, and to have a lattice constant higher than that of Cu. In this instance, the Cu content is preferably in the range of 50 to 99 atomic percent. Thus the resulting CPP magnetic detecting element can exhibit a large ΔR·A value.

Preferably, the nonmagnetic material layer 24 is deposited by sputtering. For example, if X of the Cu—X alloy constituting the nonmagnetic material layer 24 is Ag or the like, the Ag or the like has a low miscibility with Cu. Hence Cu and Ag or the like are not appropriately mixed with each other, and their solid solution is difficult to form. In such a case, the nonmagnetic material layer 24 does not have a higher lattice constant than Cu, and consequently, the lattice constant of the second magnetic layer 23*c* cannot be increased suitably.

However, by depositing the nonmagnetic material layer 24 by sputtering with a high deposition energy, the Ag or the like and Cu can be uniformly mixed with each other to form a non-equilibrium supersaturated solid solution, even if the X is Ag or the like. Thus, a nonmagnetic metal having a higher lattice constant than Cu can be used for the entire nonmagnetic material layer 24.

The thickness of the nonmagnetic material layer 24 will now be described. In general, a Cu nonmagnetic material layer 24 has a thickness in the range of about 30 to 40 Å. If the nonmagnetic material layer 24 made of a nonmagnetic metal having a higher lattice constant than Cu has an increased specific resistance, it is preferable that the thickness of the nonmagnetic material layer 24 be smaller than that of the known nonmagnetic material layer. Thus, the variation in resistance per unit area (ΔR·A) can be increased and the distance between the shield layers 20 and 30 can be reduced. If the specific resistance of the nonmagnetic material layer 24 is reduced to less than that of the known nonmagnetic material layer, it is preferable that the nonmagnetic material layer 24 be formed to a thickness close to or slightly larger than that of the known nonmagnetic material layer. However, since the nonmagnetic material layer 24 is intended to prevent magnetic coupling between the second magnetic layer 23*c* and the free magnetic layer 25, it needs to have a thickness to some extent. Preferably, the thickness of the nonmagnetic material layer 24 is in the range of 20 to 40 Å.

The material of the magnetostriction-enhancing layer 22 will be described below. The magnetostriction-enhancing layer 22 needs to be formed of a nonmagnetic metal having a higher lattice constant than that of the first magnetic layer 23*a*. Since the nonmagnetic material layer 24 is directly related to the ΔR·A value, its material needs to satisfy various requirements and there is only a narrow range of choices in material. In contrast, the magnetostriction-enhancing layer 22 is not directly related to the ΔR·A value. For example, even if the spin-dependent interface scattering coefficient γ is negative between the magnetostriction-enhancing layer 22 and the first magnetic layer 23*a*, it does not directly affect the ΔR·A value. Accordingly, the material of the magnetostriction-enhancing layer 22 can be selected in a wider range than the material of the nonmagnetic material layer 24.

For example, the magnetostriction-enhancing layer 22 may be formed of a Cu—X alloy, as in the nonmagnetic material layer 24, or an element, such as Pt, Au, Pd, Ag, Ir, or Rh, wherein X represents at least one element selected from the group consisting of Pt, Au, Pd, Ag, Ir, Rh, Ga, Ge, As, Sb, Sn, Zn, B, C, N, Al, Si, and P. Also, an element leading to a negative spin-dependent interface scattering coefficient γ, such as Ru, Re, Mo, or W, may be used singly or in combination with Cu.

Alternatively, the magnetostriction-enhancing layer 22 may be formed of an X—Mn alloy, wherein X represents at least one element selected from the group consisting of Pt, Pd, Ir, Rh, Ru, Os, Ni, and Fe. The X—Mn alloy is not suitable for the nonmagnetic material layer 24 because of its high specific resistance.

The magnetostriction-enhancing layer 22 has a thickness of about 5 to 50 Å.

The thickness in this range allows the X—Mn magnetostriction-enhancing layer 22 to maintain its initial crystal structure or face-centered cubic structure (fcc). A thickness of the magnetostriction-enhancing layer 22 of more than 50 Å is not suitable. If heat of 250° C. or more is applied to the magnetostriction-enhancing layer 22 with such a large thickness, the crystal structure is changed into a regular CuAuI-type face-centered tetragonal structure (fct). However, even the magnetostriction-enhancing layer 22 with a large thickness of more than 50 Å can maintain its initial face-centered cubic structure (fcc), as long as heat of 250° C. or more is not applied.

If the magnetostriction-enhancing layer 22 is formed of an X—Mn alloy, it is preferable that the X content in the X—Mn alloy be in the range of 45 to 99 atomic percent. An X content in this range stabilizes the magnetostriction of the first magnetic layer 23*a* with a large value.

Preferably, the magnetostriction-enhancing layer 22 and the nonmagnetic material layer 24 have face-centered cubic (fcc) structures in their respective entireties or in the vicinities of the interfaces with the magnetic layers 23*a* and 23*c*, and the equivalent crystal planes represented by {111} are preferentially oriented in the direction parallel to the interfaces.

Preferably, at least one of the magnetic layers 23*a* and 23*c* of the pinned magnetic layer 23 has a face-centered cubic (fcc) structure in its entirety or in the vicinity of the interface with the magnetostriction-enhancing layer 22 or with the nonmagnetic material layer 24, and the equivalent crystal planes represented by {111} in the fcc magnetic layer are preferentially oriented in the direction parallel to the interface.

Such a crystalline orientation facilitates the alignment of the atoms constituting the first magnetic layer 23a and magnetostriction-enhancing layer 22 and the atoms constituting the second magnetic layer 23c and nonmagnetic material layer 24, and thus readily allows the crystals in the magnetostriction-enhancing layers 22, the nonmagnetic material layer 24, and the pinned magnetic layer 23 to grow epitaxially.

Alternatively, at least one of the magnetic layers 23a and 23c may have a body-centered cubic (bcc) structure in its entirety or in the vicinity of the interface with the magnetostriction-enhancing layer 22 or with the nonmagnetic material layer 24, and the equivalent crystal planes represented by {110} in the bcc magnetic layer are preferentially oriented in the direction parallel to the interface.

In this instance, preferably the magnetostriction-enhancing layer 22 and the nonmagnetic material layer 24 have a fcc structure in their entirety or in the vicinity of the interfaces with their respective magnetic layers 23a and 23c, and the equivalent crystal planes represented by {111} are preferentially oriented in the direction parallel to the interfaces.

The atomic arrangement of the {110} equivalent crystal planes in the bcc structure is similar to that of the {111} equivalent crystal planes in the fcc structure. Crystals in the bcc structure and crystals in the fcc structure are aligned in such a manner that the atoms are stacked on top of one another or in a so-called heteroepitaxial manner.

Figure 5:
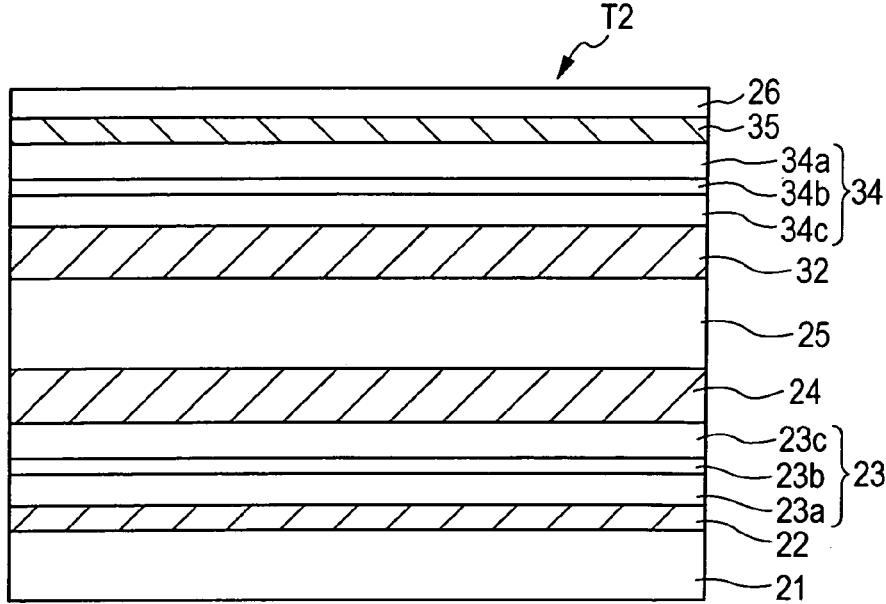
FIG. 5 is a schematic fragmentary diagram of a magnetic detecting element according to a second embodiment of the present invention, viewed from a surface opposing a recording medium.

FIG. 5 is a schematic diagram of another multilayer composite T2 having a different structure from the multilayer composite T1 of the CPP magnetic detecting element shown in FIG. 1. The multilayer composite T2 shown in FIG. 5 has a so-called dual spin-valve structure including a free magnetic layer 25, and nonmagnetic material layers 24 and 32 under and on the free magnetic layer 25. The multilayer composite T2 also includes a pinned magnetic layer 23 having an artificial ferrimagnetic structure constituted of a first magnetic layer 23a, a nonmagnetic interlayer 23b, and a second magnetic layer 23c under the nonmagnetic material layer 24; and another pinned magnetic layer 34 having an artificial ferrimagnetic structure constituted of a second magnetic layer 34c, a nonmagnetic interlayer 34b, and a first magnetic layer 34a over the nonmagnetic material layer 32. Magnetostriction-enhancing layers 22 and 35 are further disposed under and on the pinned magnetic layers 23 and 34. A seed layer 21 is disposed at the lower surface of the lower magnetostriction-enhancing layer 22, and a protective layer 26 is disposed on the upper surface of the upper magnetostriction-enhancing layer 35.

Figure 6:
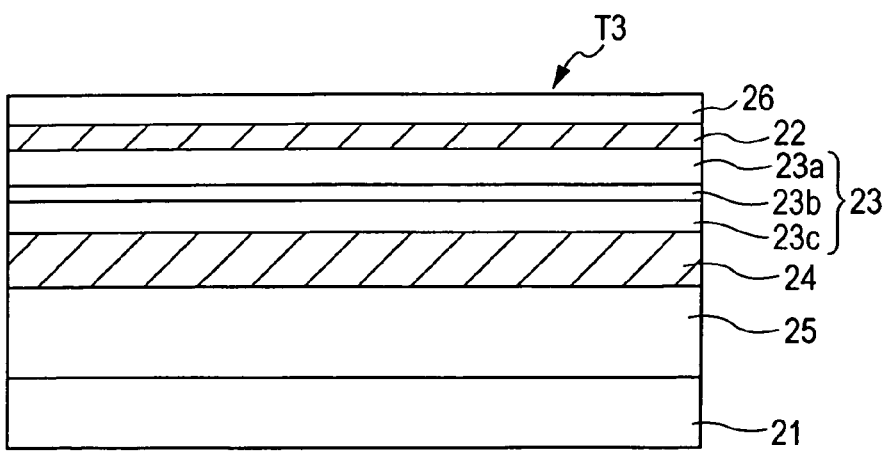
FIG. 6 is a schematic fragmentary diagram of a magnetic detecting element according to a third embodiment of the present invention, viewed from a surface opposing a recording medium.

FIG. 6 is a schematic diagram of another multilayer composite T3 having a different structure from the multilayer composite T1 of the CPP magnetic detecting element shown in FIG. 1. The multilayer composite T3 shown in FIG. 6 includes a free magnetic layer 25, a nonmagnetic material layer 24, a pinned magnetic layer 23, a magnetostriction-enhancing layer 22, and a protective layer 26 in that order on a seed layer 21. The pinned magnetic layer 23 has an artificial ferrimagnetic structure formed by depositing a second magnetic layer 23c, a nonmagnetic interlayer 23b, and a first magnetic layer 23a, in that order from below. This multilayer composite T3 is deposited in inverse order to the multilayer composite T1 shown in FIG. 1; hence, the free magnetic layer 25 underlies the pinned magnetic layer 23.

The magnetic detecting elements shown in FIGS. 5 and 6 are of CPP types, and the multilayer composites T2 and T3 are each provided with shield layers 20 and 30 doubling as electrodes at their top and bottom in the same manner as in FIG. 1.

In FIGS. 5 and 6, the magnetostriction-enhancing layer and the nonmagnetic material layer are indicated by oblique lines.

In the multilayer composites T2 and T3 shown in FIGS. 5 and 6, as well as in FIG. 1, the nonmagnetic material layer 24 (32) in contact with the second magnetic layer 23c (34c) of the pinned magnetic layer 23 (34) is formed of a nonmagnetic metal having a lattice constant higher than that of Cu. Also, the magnetostriction-enhancing layer 22 (35) is disposed on the surface opposite to the nonmagnetic material layer 24 (32) of the first magnetic layer 23a (34a) of the pinned magnetic layer 23 (34), in contact with the first magnetic layer 23a (34a). Thus, the upper and lower surfaces of the pinned magnetic layer 23 (34) lie between the magnetostriction-enhancing layer 22 (35) and the nonmagnetic material layer 24 (32) having a lattice constant higher than that of Cu.

This structure allows the magnetostriction of the pinned magnetic layer 23 (34) to increase from the upper and the lower side, and thus produces an appropriate magnetoelasticity to firmly fix the magnetization of the entire pinned magnetic layer 23 (34). Consequently, the magnetization of the pinned magnetic layer 23(34) is not distorted by a longitudinal bias magnetic field from a hard bias layer, and accordingly the distortion and asymmetry of reproduction waveforms resulting from fluctuations of the magnetization can be reduced. Also, the pinned magnetic layer 23 (34) is prevented from being reversed by electrostatic discharge (ESD) or the like. Thus, the structures as shown in FIGS. 5 and 6 can achieve a high-performance magnetic head with high reliability.

The materials and crystalline orientation of the magnetostriction-enhancing layer, nonmagnetic material layer, and pinned magnetic layer are the same as in FIG. 1.

Figure 7:
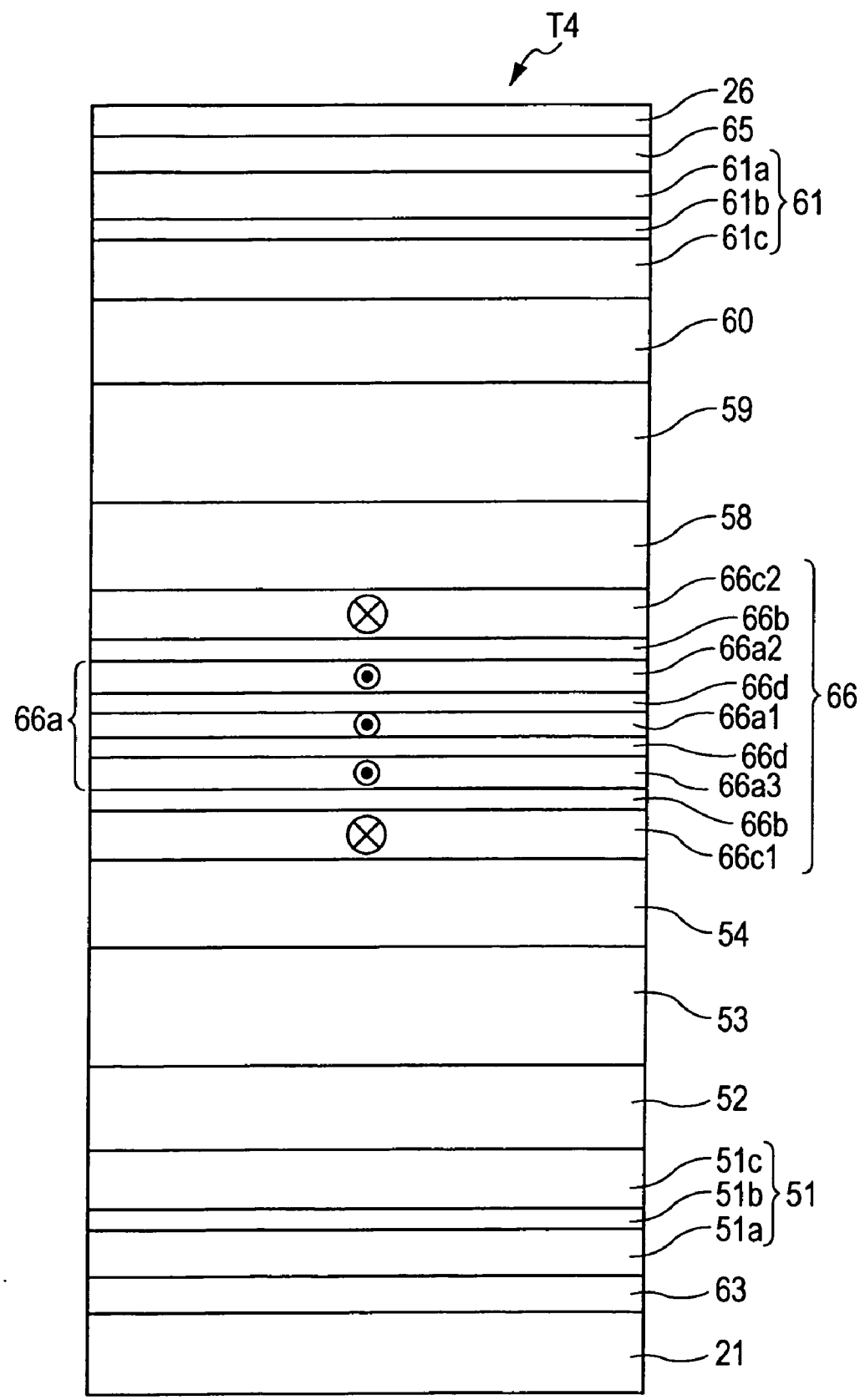
FIG. 7 is a schematic fragmentary diagram of a magnetic detecting element according to a fourth embodiment of the present invention, viewed from a surface opposing a recording medium.

FIG. 7 is a schematic diagram of another multilayer composite T4 having a different structure from the multilayer composite T1 of the CPP magnetic detecting element shown in FIG. 1.

Figure 8:
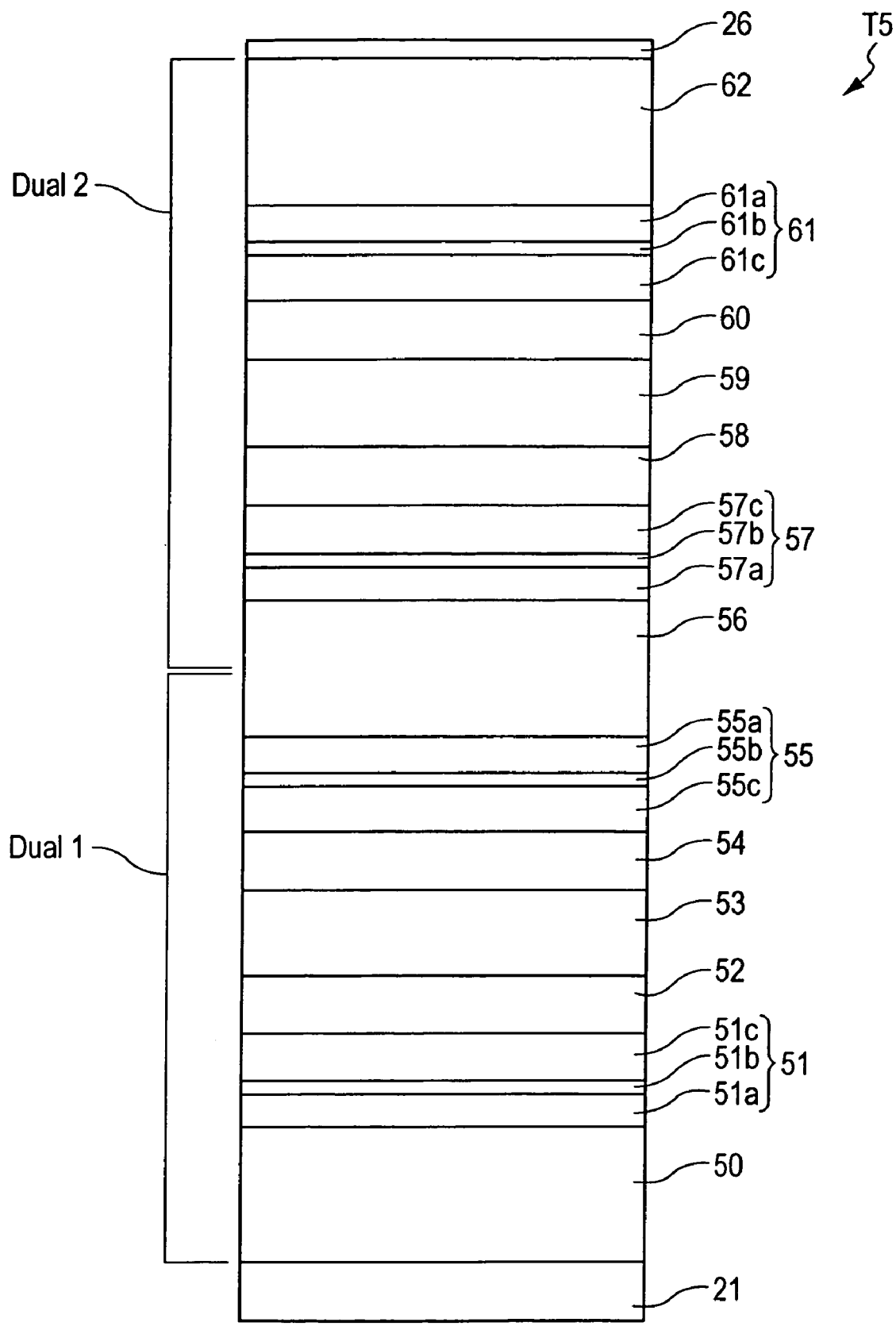
FIG. 8 is a schematic fragmentary diagram of a magnetic detecting element for comparison with the magnetic detecting element shown in FIG. 7, viewed from a surface opposing a recording medium.
Figure 9:
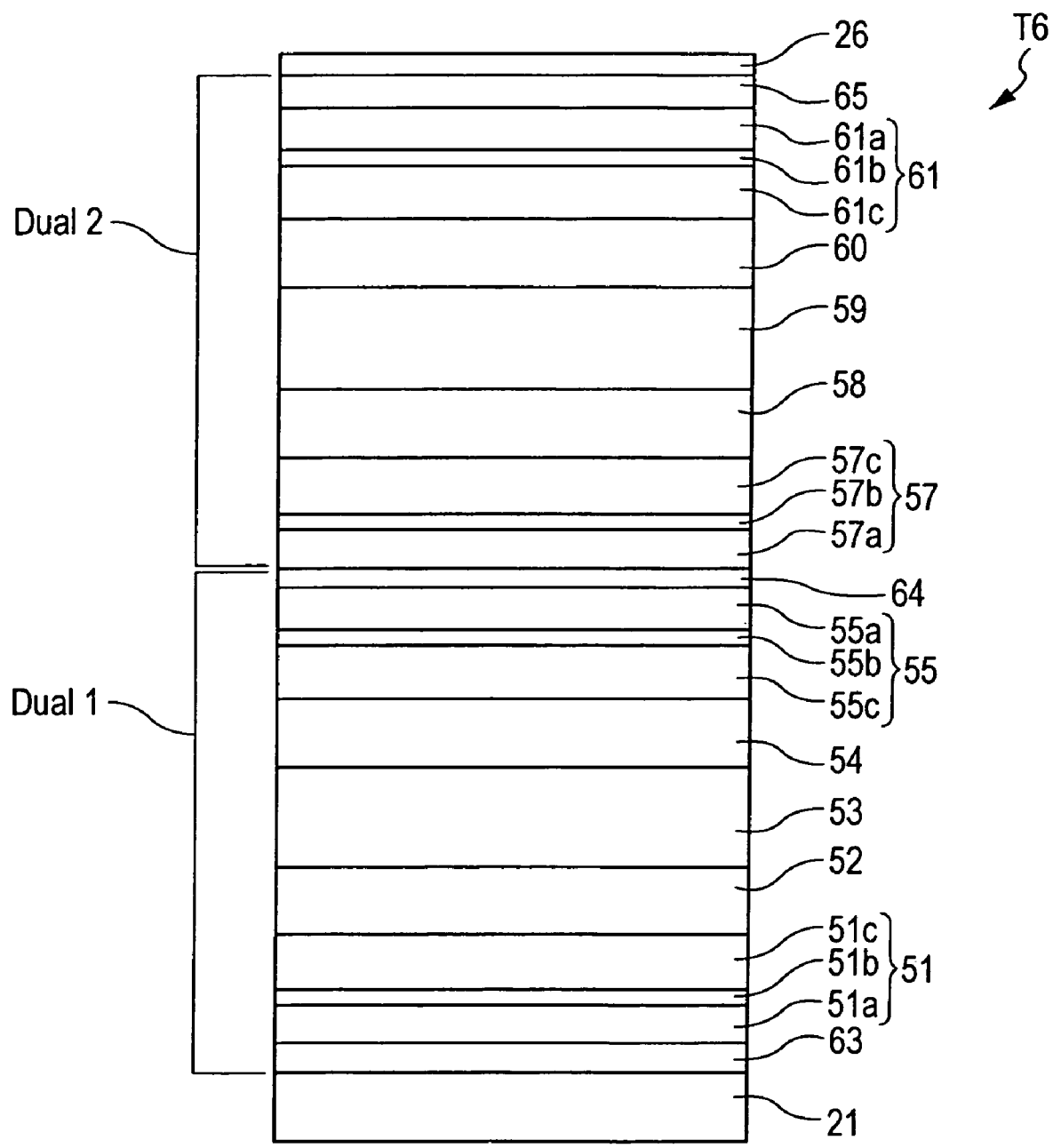
FIG. 9 is a schematic fragmentary diagram of another magnetic detecting element for comparison with the magnetic detecting element shown in FIG. 7, viewed from a surface opposing a recording medium.

Prior to the description of the multilayer composite T4 shown in FIG. 7, multilayer composites T5 and T6 shown in FIGS. 8 and 9 will be described for comparison. FIGS. 8 and 9 show the structures of comparative multilayer composites T5 and T6, respectively.

The multilayer composite T5 shown in FIG. 8 includes a seed layer 21, a first antiferromagnetic layer 50, a pinned magnetic layer 51, a nonmagnetic material layer 52, a free magnetic layer 53, a Cu nonmagnetic material layer 54, a pinned magnetic layer 55, a second antiferromagnetic layer 56, a pinned magnetic layer 57, a nonmagnetic material layer 58, a free magnetic layer 59, a nonmagnetic material layer 60, a pinned magnetic layer 61, a third antiferromagnetic layer 62, and a protective layer 26, which are deposited in that order from below. The four pinned magnetic layers each have an artificial ferrimagnetic structure.

In this multilayer composite T5, the layers from the lowermost antiferromagnetic layer or first antiferromagnetic layer 50 to second antiferromagnetic layer 56 lying in about the middle of the multilayer composite T5 define a first dual spin-valve structure (Dual 1), and the layers from the second antiferromagnetic layer 56 to the uppermost antiferromagnetic layer or third antiferromagnetic layer 62 define a second dual spin-valve structure (Dual 2).

Thus, the multilayer composite T5 shown in FIG. 8 has two dual spin-valve structures stacked on top of one the other.

The multilayer composite T5 can produce the GMR effect in CPP magnetic detecting elements using spin-dependent bulk scattering. However, the structure shown in FIG. 8 has three antiferromagnetic layers 50, 56, and 62 with large thicknesses and high specific resistances, and these antiferromagnetic layers generate Joule heat to cause lattice vibration and electromigration. Consequently, the GMR effect and the reproduction power cannot be appropriately enhanced.

In the multilayer composite T6 shown in FIG. 9, the antiferromagnetic layers 50, 56, and 62 shown in FIG. 8 are replaced with magnetostriction-enhancing layers 63, 64, and 65. The magnetostriction-enhancing layers 63, 64, and 65 are formed of, for example, a PtMn alloy. In the multilayer composite T6, the first magnetic layers 51a, 55a, 57a, and 61a of the pinned magnetic layers 51, 55, 57, and 61 are defined by the magnetic layers most distant from the respective Cu nonmagnetic material layers 52, 54, 58, and 60, and the magnetostriction-enhancing layers 63, 64, and 65 are disposed in contact with the respective first magnetic layers 51a, 55a, 57a, and 61a. Thus, the uniaxial anisotropies of the pinned magnetic layers 51, 55, 57, and 61 are increased by use of inverse magnetostriction, thereby fixing their magnetizations.

By use of the thin magnetostriction-enhancing layers 63, 64, and 65, as in the multilayer composite T6 shown in FIG. 9, instead of the antiferromagnetic layers 50, 56, and 62 used in the multilayer composite T5 shown in FIG. 8, the GMR effect and the reproduction power can be increased.

Even in the structure shown in FIG. 9, however, the magnetostriction-enhancing layer 64 lying in about the middle of the multilayer composite T6 needs to have a large thickness to some extent in order to magnetically separate the overlying and underlying dual spin-valve structures (Dual 1 and Dual 2).

If the magnetostriction-enhancing layers 63, 64, and 65 are formed of a material having a relatively high specific resistance, such as a PtMn alloy, they can generate heat. The magnetostriction-enhancing layer 64 in about the middle of the multilayer composite T6 does not efficiently dissipate the heat because it is quite distant from the upper and lower electrodes, and the Joule heat from the magnetostriction-enhancing layer 64 causes lattice vibration and electromigration to degrade the GMR effect and the reproduction power. Furthermore, in the structure shown in FIG. 9, the magnetostriction coefficient λs is increased only in the first magnetic layers 51a, 55a, 57a, and 61a among the magnetic layers of the pinned magnetic layers 51, 55, 57, and 61. Specifically, the magnetostriction coefficients λs of the second magnetic layers 51c, 55c, 57c, and 61c in contact with the respective Cu nonmagnetic material layers 52, 54, 58, and 60 cannot be increased appropriately. It is desired to further increase the magnetostriction coefficients λs of the pinned magnetic layers 51, 55, 57, and 61 in a CPP structure.

Accordingly, an embodiment shown in FIG. 7 is provided. The multilayer composite T4 according to this embodiment includes a pinned magnetic layer composed of 9 sublayers in the middle of the multilayer composite T4, and nonmagnetic material layers, free magnetic layers, nonmagnetic material layers, pinned magnetic layers, and magnetostriction-enhancing layers over and under the 9-layer pinned magnetic layer.

As shown in FIG. 7, a magnetostriction-enhancing layer 63, a pinned magnetic layer 51, a nonmagnetic material layer 52, a free magnetic layer 53, and a nonmagnetic material layer 54 are deposited in that order on a seed layer 21.

While the structure shown in FIG. 9 has two pinned magnetic layers 55 and 57 disposed over the nonmagnetic material layer 54, magnetically separated by the magnetostriction-enhancing layer 64, the structure shown in FIG. 7 has only one pinned magnetic layer 66 composed of many sublayers over the nonmagnetic material layer 54.

The 9-layer pinned magnetic layer 66 includes a 5-layer first magnetic layer 66a composed of three magnetic sublayers 66a1, 66a2, and 66a3 and magnetostriction-enhancing layers 66d each disposed between the magnetic sublayers. Each magnetostriction-enhancing layer 66d has such a small thickness as to allow ferromagnetic coupling between the magnetic sublayers without magnetically separating them. Consequently, the magnetic sublayers 66a1, 66a2, and 66a3 are all magnetized in the same direction.

Second magnetic layers 66c1 and 66c2 are disposed over and under the first magnetic layer 66a, each separated by a nonmagnetic interlayer 66b made of Ru or the like. Thus the 9-layer pinned magnetic layer 66 is structured, as shown in FIG. 7.

The nonmagnetic material layer 54 under the pinned magnetic layer 66 and the nonmagnetic material layer 52 over the pinned magnetic layer 51 are formed of a nonmagnetic metal having a lattice constant higher than that of Cu.

The layers over the pinned magnetic layer 66 are disposed in this order: a nonmagnetic material layer 58, a free magnetic layer 59, a nonmagnetic material layer 60, a pinned magnetic layer 61, a magnetostriction-enhancing layer 65, and a protective layer 26 in that order.

The nonmagnetic material layers 58 and 60 are formed of a nonmagnetic metal having a lattice constant higher than that of Cu.

The multilayer composite T6 shown in FIG. 9 has the two magnetically separated pinned magnetic layers 55 and 57 in about the middle. In the multilayer composite T4 shown in FIG. 7, these pinned magnetic layers 55 and 57 are combined into the single pinned magnetic layer 66 in about the middle of the structure. By forming the first magnetic layer 66a of the pinned magnetic layer 66 with the three magnetic sublayers separated by the very thin magnetostriction-enhancing layers 66d, as shown in FIG. 7, the magnetostriction coefficient of the first magnetic layer 66a can be increased, and the magnetostriction-enhancing layer 64 with a relatively large thickness shown in FIG. 9 becomes unnecessary.

By forming the nonmagnetic material layers 52, 54, 58, and 60 of a nonmagnetic metal having a lattice constant higher than that of Cu, the magnetostriction coefficients of the second magnetic layers 51c, 66c1, 66c2, and 61c can be appropriately increased.

Thus, the structure shown in FIG. 7 makes it possible to eliminate heat source layers to prevent the generation of Joule heat, in comparison with the structure shown in FIG. 9. Thus, lattice vibration and electromigration due to the Joule heat can be prevented to suppress the degradation of the GMR effect. In addition, the magnetization of the pinned magnetic layer 66 can be fixed more appropriately to enhance and stabilize the GMR effect and reproduction power.

What is claimed is:

1. A magnetic detecting element comprising:
   a multilayer composite constituted of a plurality of layers in which current flows in a direction perpendicular to the surfaces of the layers, the multilayer composite comprising:

a free magnetic layer, a nonmagnetic material layer made of a nonmagnetic metal having a lattice constant higher than that of Cu;

a pinned magnetic layer including a plurality of magnetic layers and at least one nonmagnetic interlayer separating the magnetic layers from one another, the magnetic layers including a first magnetic layer located most distant from the nonmagnetic material layer and a second magnetic layer located closest to and in contact with the nonmagnetic material layer; and a magnetostriction-enhancing layer made of a nonmagnetic metal, disposed on the surface opposite to the nonmagnetic material layer of the first magnetic layer;

wherein the upper surface and the lower surface of the pinned magnetic layer lie between the magnetostriction-enhancing layer and the nonmagnetic material layer; at least part of crystals in the magnetostriction-enhancing layer and the first magnetic layer and at least part of crystals in the nonmagnetic material layer and the second magnetic layer are present in an epitaxial state or a heteroepitaxial state; and the surface opposing a recording medium of the pinned magnetic layer is open.

2. The magnetic detecting element according to claim 1, wherein the nonmagnetic material layer comprises a Cu—X alloy, wherein X represents at least one element selected from the group consisting of Pt, Au, Pd, Ag, Ir, Rh, Ga, Ge, As, Sb, Sn, Zn, B, C, N, Al, Si, and P.

3. The magnetic detecting element according to claim 2, wherein the interface between the nonmagnetic material layer and the second magnetic layer has a positive spin-dependent interface scattering coefficient.

4. The magnetic detecting element according to claim 3, wherein X is at least one element selected from the group consisting of Pt, Au, Pd, Ag, Ir, and Rh.

5. The magnetic detecting element according to claim 2, wherein the Cu content in the non magnetic material layer is in the range of 50 to 99 atomic percent and the balance comprises X.

6. The magnetic detecting element according to claim 1, wherein the non magnetic material layer is formed by sputtering.

7. The magnetic detecting element according to claim 1, wherein the second magnetic layer has a positive spin-dependent bulk scattering coefficient.

8. The magnetic detecting element according to claim 7, wherein at least part of the second magnetic layer comprises a Heusler alloy expressed by $Co_2MnY$, wherein Y represents at least one element selected from the group consisting of Al, Si, Ga, Ge, and Sn.

9. The magnetic detecting element according to claim 7, wherein at least part of the second magnetic layer comprises a magnetic material selected from the group consisting of Co, CoFe, Co-Z, CoFe-Z, and Ni-Q, wherein Z represents at least one element selected from the group consisting of Ti, Zr, Ta, Hf, Sc, V, Mn, Y, and Nb, and Q represents at least one element selected from the group consisting of Rh, Ir, Be, Al, Si, Ga, Ge, Ti, Mn, Zn, Cd, and Sn.

10. The magnetic detecting element according to claim 1, wherein the magnetostriction-enhancing layer comprises an alloy expressed by X—Mn, wherein X represents at least one element selected from the group consisting of Pt, Pd, Ir, Rh, Ru, Os, Ni, and Fe.

11. The magnetic detecting element according to claim 1, wherein the magnetostriction-enhancing layer has a face-centered cubic structure in the entirety thereof or in the vicinity of an interface with the first magnetic layer, the nonmagnetic material layer has a face-centered cubic structure in the entirety thereof or in the vicinity of an interface with the second magnetic layer, and equivalent crystal planes represented by {111} in the face-centered cubic structures are preferentially oriented in the direction parallel to the interfaces.

12. The magnetic detecting element according to claim 1, wherein at least one of the first magnetic layer has a face-centered cubic structure in the entirety thereof or in the vicinity of an interface with the magnetostriction-enhancing layer or the second magnetic layer has a face-centered cubic structure in the entirety thereof or in the vicinity of an interface with the nonmagnetic material layer, and equivalent crystal planes represented by {111} in the face-centered cubic structure are preferentially oriented in the direction parallel to the corresponding interface.

13. The magnetic detecting element according to claim 1, wherein at least one of the first magnetic layer has a body-centered cubic structure in the entirety thereof or in the vicinity of an interface with the magnetostriction-enhancing layer or the second magnetic layer has a body-centered cubic structure in the entirety thereof or in the vicinity of an interface with the nonmagnetic material layer, and equivalent crystal planes represented by {110} in the body-centered cubic structure are preferentially oriented in the direction parallel to the corresponding interface.

* * * * *